(12) United States Patent
Raffy

(10) Patent No.: US 10,240,023 B2
(45) Date of Patent: Mar. 26, 2019

(54) POLYMER-CERAMIC COMPOSITES

(71) Applicant: SAINT-GOBAIN CENTRE DE RECHERCHES ET D'ETUDES EUROPEEN, Courbevoie (FR)

(72) Inventor: Stéphane Raffy, Cavaillon (FR)

(73) Assignee: SAINT-GOBAIN CENTRE DE RECHERCHES ET D'ETUDES EUROPEEN, Courbevoie (FR)

( * ) Notice: Subject to any disclaimer, the term of this patent is extended or adjusted under 35 U.S.C. 154(b) by 0 days.

(21) Appl. No.: 15/706,026

(22) Filed: Sep. 15, 2017

(65) Prior Publication Data

US 2018/0022889 A1 Jan. 25, 2018

Related U.S. Application Data

(62) Division of application No. 15/129,633, filed as application No. PCT/FR2015/050783 on Mar. 26, 2015, now Pat. No. 10,113,048.

(30) Foreign Application Priority Data

Mar. 28, 2014 (FR) ...................................... 14 52720

(51) Int. Cl.
  *C08K 3/22* (2006.01)
  *H05K 1/16* (2006.01)
  *H05K 9/00* (2006.01)

(52) U.S. Cl.
  CPC ............... *C08K 3/22* (2013.01); *H05K 1/162* (2013.01); *H05K 9/0083* (2013.01); *C08K 2003/2237* (2013.01); *C08K 2201/001* (2013.01); *H05K 2201/0187* (2013.01); *H05K 2201/0209* (2013.01)

(58) Field of Classification Search
  None
  See application file for complete search history.

(56) References Cited

U.S. PATENT DOCUMENTS

| 4,422,917 | A | 12/1983 | Hayfield |
| 7,815,820 | B2 | 10/2010 | Tan et al. |
| 2004/0072074 | A1 | 4/2004 | Partington |
| 2008/0128961 | A1 | 6/2008 | Slenes et al. |
| 2009/0073636 | A1 | 3/2009 | Pramanik et al. |
| 2009/0101873 | A1 | 4/2009 | Tan et al. |
| 2010/0105806 | A1 | 4/2010 | Yang et al. |
| 2011/0123867 | A1* | 5/2011 | Ellis ..................... C01G 23/043 429/231.5 |
| 2012/0171569 | A1 | 7/2012 | Jones |

FOREIGN PATENT DOCUMENTS

| EP | 0 047 595 A1 | 3/1982 |
| EP | 0 443 229 A1 | 8/1991 |
| WO | WO 92/14683 A1 | 9/1992 |
| WO | WO 97/20324 A1 | 6/1997 |
| WO | WO 97/42639 A1 | 11/1997 |
| WO | WO 98/26431 A1 | 6/1998 |
| WO | WO 03/005444 A2 | 1/2003 |
| WO | WO 2009/024776 A1 | 2/2009 |
| WO | WO 2010/048297 A2 | 4/2010 |

OTHER PUBLICATIONS

Non-Final Office Action as issued in U.S. Appl. No. 15/129,633, dated Oct. 27, 2017.
International Search Report as issued in International Patent Application No. PCT/FR2015/050783, dated Jun. 9, 2015.
International Preliminary Report on Patentability and the Written Opinion of the International Searching Authority as issued in International Patent Application No. PCT/FR2015/050783, dated Oct. 4, 2016.
Notice of Allowance as issued in U.S. Appl. No. 15/129,633, dated Jun. 25, 2018.
Final Office Action as issued in U.S. Appl. No. 15/129,633, dated May 29, 2018.

* cited by examiner

*Primary Examiner* — Robert T Butcher
(74) *Attorney, Agent, or Firm* — Pillsbury Winthrop Shaw Pittman LLP

(57) ABSTRACT

Polymer-ceramic composites, in particular for the field of electronics, include grains of titanium suboxides of general formulation $TiO_x$ in which x is between 1.00 and 1.99, limits included, and/or of barium and/or strontium titanate suboxides of general formulation $Ba_{(1-m)}Sr_mTiO_y$ in which y is between 1.50 and 2.99, limits included, and m is between 0 and 1, limits included.

8 Claims, No Drawings

POLYMER-CERAMIC COMPOSITES

CROSS-REFERENCE TO RELATED APPLICATIONS

This application is a divisional of U.S. patent application Ser. No. 15/129,633, filed on Sep. 27, 2016, which is the U.S. National Stage of International Application Serial No. PCT/FR2015/050783, filed Mar. 26, 2015, which in turn claims priority to French Application No. 1452720, filed Mar. 28, 2014. The contents of all of these applications are incorporated herein by reference in their entirety.

The invention relates to polymer-ceramic composites in particular for electronic applications comprising grains of titanium suboxides or of barium or strontium titanate suboxides. Titanium suboxides is conventionally understood to mean titanium oxides of general formulation $TiO_x$ in which x is between 1 and 2, limits excluded, in particular "Magneli" phases. Barium/strontium titanate suboxides is conventionally understood to mean oxides of general formulation $Ba_{(1-m)}Sr_mTiO_y$ in which y is between 1.5 and 3, limits excluded, and m is between 0 and 1, limits included.

The patent EP 047 595 B1 (or its equivalent U.S. Pat. No. 4,422,917) provides materials composed of suboxide of $TiO_x$ type with x between 1.55 and 1.95, for the preparation of electrodes. The materials are synthesized from $TiO_2$ power by mixing with a reducing compound of the Ti, TiN, TiSi, C, TiO or $Ti_2O_3$ type, at temperatures of between 1150 and 1450° C., depending on the nature of the reducing compound.

The patent EP 572 559 B1 describes, for this same application, the use of titanium suboxides entirely composed of Magneli phases corresponding to the composition $Ti_nO_{2n-1}$, with n greater than 4. The patent describes a process for obtaining such materials including a first stage substantially identical to that described in EP 047 595 B1, followed by an additional stage of annealing at a temperature of between 1100 and 1300° C., in the presence of hydrogen, in order to remove all the lower titanium oxides.

The international patent application WO2009/024776 describes similar materials, essentially composed of a mixture of the "Magneli" crystalline phases $Ti_4O_7$, $Ti_5O_9$ and $Ti_6O_{11}$. It is indicated that such a composition makes possible a better compromise between the electrical conductivity of the particles of titanium suboxides and their resistance to corrosion, the $Ti_4O_7$ phase being described as the most advantageous in obtaining the highest conductivities. The method for obtaining such particles is described as identical to that described in the patent U.S. Pat. No. 4,422,917 and consists of a reduction by hydrogen of a $TiO_2$ powder for 8 hours and at a temperature of 1180° C.

The polymer-ceramic composites according to the present invention have applications in particular in the specific field of electronic components.

Current electronic systems comprise active components and passive components. The latter are the resistors, inductive devices and capacitors; their number continues to increase, while their functionalities simultaneously diversify: for example, the ratio of the passive components to the active components in a portable telephone is greater than 20. Currently, the majority of the active components are fitted to the surface of the electronic circuits in discrete form, which limits the miniaturization of the circuits and can present problems of reliability as a result of the amount of weldings necessary. For these reasons, passive components "embedded" in electronic boards present increasing interest and in particular "embedded capacitors", as a result of the very great variety of functions which they can provide: signal decoupling, noise suppression or reduction, filtering, and the like. Embedded capacitors are generally composed of a polymer-ceramic composite laminated between two conductive plates or films: the polymer can be an epoxy resin or PTFE, for example; the ceramic charge can be barium titanate $BaTiO_3$; the conductive electrodes are often made of copper. The very active research in this field shows that there exists a great need to increase the dielectric permittivity of these polymer-ceramic composites, in order to increase the capacitance of the "embedded capacitors".

The patent application WO2010/048297 thus describes polymer-ceramic composites for electronic components, such as capacitors. They are composites in which the ceramic charge can be composed of $BaTiO_3$ and/or $(Ba,Sr)TiO_3$ and/or $TiO_2$.

Furthermore, the increasing complexity of electronic devices, their ever greater working speed and density, have greatly increased the risk of electromagnetic interference, which represents a danger for the correct operation of electronic devices, for the quality of communications. Various types of protection have thus been developed, in order to insulate the electronic components from the waves produced by neighboring appliances. Conventionally, three phenomena which make it possible to attenuate the electromagnetic wave reaching a shielding system are distinguished: reflection, absorption and multiple internal reflections. The complete attenuation of the amplitude of the wave, expressed in decibels, is thus the sum of these three components.

The first shields were made of metal and efficiently reflected the waves; however, the weight of a metal shield constitutes a disadvantage which is often totally unacceptable. Polymer-conductive filler composites subsequently appeared as shielding or protective element against waves, making it possible in particular to limit electromagnetic interference, it being possible, for example, for the conductive fillers to be metal fibers. However, these metal fillers, used to reflect the waves, exhibit a low resistance to corrosion and oxidation and a high density which limit their use.

The patent U.S. Pat. No. 7,815,820 describes polymer-ceramic composites as protective element against waves making possible the attenuation of electromagnetic waves. They are composites in which the ceramic charge can be composed of $BaTiO_3$ and/or $SrTiO_3$ and/or $(Ba,Sr)TiO_3$.

There still exists a need for polymer-charges which make it possible to more efficiently attenuate electromagnetic waves. The attenuation by absorption can be improved with a material exhibiting a higher dielectric permittivity.

There thus exist several fields in which a need is encountered for polymer-charge composites exhibiting an improved dielectric permittivity. The subject matter of the present invention is targeted at meeting this need.

The invention relates, according to a first aspect, to an element for electronics comprising or consisting of a polymer-ceramic composite comprising grains of titanium suboxides of general formulation $TiO_x$ in which x is between 1.00 and 1.99, limits included, and/or of barium and/or strontium titanate suboxides of general formulation $Ba_{(1-m)}Sr_mTiO_y$ in which y is between 1.50 and 2.99, limits included, and m is between 0 and 1, limits included.

More particularly, the invention relates to polymer-ceramic composites composed of a polymer matrix in which a ceramic charge is dispersed, in particular for use in the field of electronics.

The invention also relates to a polymer-ceramic composite comprising grains of barium and/or strontium titanate suboxides of general formulation $Ba_{(1-m)}Sr_mTiO_y$, in which y is between 1.50 and 2.99, limits included, and m is between 0 and 1, limits included.

In the element or in the composite according to the invention:

The polymer matrix can represent more than 30% by volume of composite, indeed even more than 40% by volume, indeed even more than 50% by volume. The polymer matrix can represent up to 80% of the volume of the composite. The polymer matrix preferably represents less than 70% by volume of the composite, indeed even less than 60% by volume.

The ceramic charge (that is to say, the ceramic part) can represent, in total, more than 10% by volume of the composite, indeed even more than 20% by volume, indeed even more than 30% by volume. The ceramic charge can represent up to 70% by volume of the composite. It can preferably represent less than 60% by volume, indeed even less than 50% by volume, or even less than 40% by volume.

The polymer matrix can be composed, for example, of resin of the epoxy, polyvinylidene fluoride (PVDF), polytetrafluoroethylene (PTFE), polyimide, polyamide, acrylate, polyphenylene ether, polyphenylene oxide, benzocyclobutene, bismaleimide, cyanate ester or polyester type or their mixtures.

According to a first possible embodiment, the resin is chosen from thermosetting resins.

According to a second possible embodiment, the resin is chosen from thermoplastic resins.

The ceramic charge can comprise or be composed of grains of titanium suboxides of general formulation $TiO_x$ in which x is greater than 1.40, indeed even greater than 1.60, indeed even greater than 1.70, and/or in which x is less than 1.99, indeed even less than 1.95, indeed even less than 1.90.

According to one embodiment, the grains of titanium suboxides represent more than 10% by volume, indeed even more than 20% by volume, indeed even more than 30% by volume, of the polymer-ceramic composite.

In particular, said titanium suboxides are preferably mainly $Ti_nO_{2n-1}$ phases in which n is between 4 and 9, limits included, that is to say $Ti_4O_7$, $Ti_5O_9$, $Ti_6O_{11}$, $Ti_7O_{13}$, $Ti_8O_{15}$ or $Ti_9O_{17}$, said phases preferably representing, in total, more than 80%, indeed even 85% or even 90%, of the weight of the grains. In particular, according to an advantageous form, the $Ti_5O_9$ and/or $Ti_6O_{11}$ phases can represent, in total, more than 60% of the weight of the grains, preferably more than 70% of the weight of the grains, and very preferably more than 80% of the weight of the grains.

The ceramic charge can alternatively or additionally comprise or be composed of grains of barium and/or strontium titanate suboxides. These grains exhibit a general formulation $Ba_{(1-m)}Sr_mTiO_y$, in which, preferably:

y is greater than 1.70, indeed even greater than 2.00, indeed even greater than 2.25, indeed even greater than 2.50, and/or y is less than 2.95, indeed even less than 2.90, and/or m is less than 0.9, indeed even less than 0.70, indeed even less than 0.5, indeed even less than 0.3, indeed even less than 0.1.

According to a preferred form, m is between 0 and 0.3.

According to one embodiment, the grains of barium and/or strontium titanate suboxides represent more than 10% by volume, indeed even more than 20% by volume, indeed even more than 30% by volume, of the polymer-ceramic composite.

According to one embodiment of the invention, the grains of titanium suboxides and the grains of barium/strontium titanate suboxides together represent more than 10% by volume, indeed even more than 20% by volume, indeed even more than 30% by volume, indeed even more than 40% by volume, of the polymer-ceramic composite. The grains of titanium suboxides and the grains of barium/strontium titanate suboxides together preferably represent less than 70% by volume of said composite, preferably less than 60% by volume, indeed even less than 50% by volume, or even less than 40% by volume.

The various phases constituting the grains and their proportions can be determined according to techniques well known in the field, in particular by X-ray diffraction. It is observed that the $Ba_{(1-m)}Sr_mTiO_y$ phase exists in an at least partially hexagonal crystalline form, whereas $Ba_{(1-m)}Sr_m$-$TiO_3$ exists in a cubic or tetragonal crystalline form.

The ceramic charge in the composite can, however, comprise other entities than the titanium and/or barium/strontium titanate suboxides, in particular silica ($SiO_2$), or else other elements, present essentially in the oxide form or in solid solution with the titanium and/or titanate suboxide(s), in particular Al, Cr, Zr, Y, La, Nb, Ta, Fe, Co, Ni, alkali metals or alkaline earth metals of the Ca, Na, K or Li type. On the basis of the corresponding simple oxides, the total summed amounts of said elements present is preferably less than 30% by weight of the polymer-ceramic composite, for example less than 20%, indeed even 10%, indeed even 5%, indeed even less than 4%, or even less than 3% by weight of the polymer-ceramic composite.

According to the invention, on the other hand, the polymer and the titanium suboxides normally represent more than 70% of the total weight of the composite and in particular more than 80%, more than 90% or even more than 95%, indeed even more than 96% or even more than 97% of the weight of the composite.

According to a preferred embodiment, the ceramic charge is composed, to more than 80% by weight, of grains of titanium suboxides of general formulation $TiO_x$ and/or of grains of barium/strontium titanate suboxides of general formulation $Ba_{(1-m)}Sr_mTiO_y$. Preferably, these grains constitute more than 85% by weight, indeed even more than 90% by weight, indeed even more than 95% by weight, indeed even more than 99% by weight of the ceramic charge.

According to a possible form, the inorganic charge in said composite is essentially composed of grains of titanium suboxides.

According to another form, the inorganic charge in said composite is essentially composed of grains of barium and/or strontium titanate suboxides of general formulation $Ba_{(1-m)}Sr_mTiO_y$.

According to a possible embodiment, the grains of the ceramic charge are obtained by reaction in the solid state, that is to say by sintering precursor reactants, without melting. The reduced state is obtained either by carrying out the reactive sintering in a reducing medium (for example under hydrogen partial pressure) or by adding a reducing agent (for example a carbon source, such as coke) to the initial reactants and by carrying out the reactive sintering under a neutral atmosphere (for example under argon), or by carrying out the reactive sintering under an oxidizing atmosphere and then by post-treating the grains under a reducing atmosphere, or also by carrying out the reactive sintering under an oxidizing atmosphere and by then adding a reducing element, such as carbon, to the grains thus obtained and by calcining under a neutral atmosphere (for example under argon).

According to another embodiment, the ceramic charge comprises fused grains.

Fused grains is understood to mean grains obtained by a manufacturing process comprising the following stages:
 a) the melting, under reducing conditions, of an initial mixture (or initial charge) comprising particles of titanium dioxide, optionally of barium oxide, optionally of strontium oxide, of their precursors, at a temperature of greater than 1500° C., preferably at a temperature of greater than 1600° C., indeed even of greater than 1700° C.,
 b) the cooling of the molten mixture until it solidifies,
 c) the grinding of the solidified mass in order to obtain fused grains of the suboxide(s).

According to preferred embodiments of the process:

The initial mixture comprises coke, used as reducing agent.

The initial mixture comprises between 1 and 25% by weight of coke, with respect to the total weight of the mixture, preferably between 10 and 18% by weight of coke. The melting is carried out under air. It is also possible to carry out the melting without addition of coke, and to then calcine the fused grains under a reducing atmosphere, or else to mix them with a reducing agent and to calcine them under a neutral atmosphere.

The titanium, barium and strontium oxides or their precursors represent more than 90% of the total inorganic mass present in the initial mixture and preferably represent all of the inorganic mass present in the initial mixture.

During stage a), an electric arc furnace is preferably used but all known furnaces can be envisaged, such as an induction furnace or a plasma furnace, provided that they make it possible to completely melt the initial mixture or charge. According to an alternative form, the melting can be carried out in a plasma torch. In this case, use of coke is not essential in the initial mixture, it being possible for the reduction to be obtained by adjusting the atmosphere of the plasma. The fused grains obtained after stage c) can also be again melted in a plasma torch.

In stage c), the solidified mass is ground, according to conventional techniques, until the size of the grains specific to the application envisaged is obtained. For example, the grinding can be continued until grains of millimetric size, for example of the order of 0.1 to 5 millimeters, indeed even of micrometric size, for example of the order of 0.1 to 50 microns are obtained.

Preferably, the fused grains comprise, in total, more than 92%, indeed even more than 94%, or also more than 95%, of titanium suboxide(s) and/or of barium/strontium titanate suboxides.

However, the fused grains can comprise other phases, in particular silica ($SiO_2$), or else other elements, essentially present in the oxide form or in solid solution with the titanium suboxide(s), in particular Al, Cr, Zr, Y, La, Nb, Ta, Fe, Co, Ni, alkali metals or alkaline earth metals of the Ca, Na, K or Li type. On the basis of the corresponding simple oxides, the total summed amount of said elements present is preferably less than 10% by weight of the total mass of the grains, for example less than 5%, indeed even less than 4%, or even less than 3%, by weight of the total mass of the fused grains.

In addition, the fused grains can comprise traces of nitrides (titanium nitrides, oxynitrides or carbonitrides) or of carbides.

According to a preferred form, the fused grains according to the invention are composed solely of said titanium suboxides and/or titanate suboxides, the other phases only being present in the form of unavoidable impurities.

According to one embodiment, the fused grains correspond essentially to a mean overall formulation $TiO_x$ in which x is between 1.50 and 1.95 and preferably in which x is between 1.75 and 1.85, more preferably between 1.75 and 1.80.

In particular, said titanium suboxides are preferably mainly $Ti_nO_{2n-1}$ phases in which n is between 4 and 9, limits included, that is to say $Ti_4O_7$, $Ti_5O_9$, $Ti_6O_{11}$, $Ti_7O_{13}$, $Ti_8O_{15}$ or $Ti_9O_{17}$, said phases preferably representing, in total, more than 80%, indeed even 85% or even 90%, of the weight of the grains.

In particular, according to an advantageous form, $Ti_5O_9$ and/or $Ti_6O_{11}$ phases can represent, in total, more than 60% of the weight of the grains, preferably more than 70% of the weight of the grains and very preferably more than 80% of the weight of the grains. Preferably, according to such a form, the grains comprise less than 30% by weight of $Ti_4O_7$. Such fused grains exhibit a relatively low electrical resistivity and a good resistance to corrosion.

According to another possible and alternative embodiment, the polymer-ceramic composite may, however, also not comprise said fused grains essentially composed of phases of titanium suboxides corresponding to the formulation $Ti_nO_{2n-1}$ in which said phases are mainly $Ti_5O_9$ or $Ti_6O_{11}$ or a mixture of these two phases, said phases $Ti_5O_9$ and/or $Ti_6O_{11}$ representing, in total, more than 60% of the weight of the grains, said grains additionally comprising less than 30% by weight of $Ti_4O_7$.

According to one embodiment, the ceramic charge is composed, to more than 80% by weight, of grains of titanium suboxides of general formulation $TiO_x$ and/or of grains of barium/strontium titanate suboxides of general formulation $Ba_{(1-m)}Sr_mTiO_y$. Preferably, these grains constitute more than 85% by weight, indeed even more than 90% by weight, indeed even more than 95% by weight, indeed even more than 99% by weight, of the ceramic charge.

Advantageously, the ceramic charge exhibits a sufficient permittivity which is greater than 100, indeed even greater than 500, and a limited resistivity which is less than 1 Ω·cm.

The polymer-ceramic composites according to the invention comprising such a ceramic charge thus exhibit an improved permittivity, that is to say a permittivity which is greater than that obtained with composites of the state of the art or else an equivalent permittivity for a reduced content of ceramic charge.

According to one embodiment, of use in particular for the attenuation of electromagnetic waves, the polymer-ceramic ceramic composite additionally comprises up to 30% by volume of magnetic charges, in particular ceramic magnetic charges (for example an iron oxide, in particular in the $Fe_2O_3$ or $Fe_3O_4$ form) or metal magnetic charges.

According to one embodiment, the grains of titanium suboxides and/or of titanate suboxides are coated with a layer which makes it possible to provide better cohesion with the polymer matrix and/or good electrical insulation. This layer can, for example, be composed of silica, silicate or silane. This layer can, for example, be obtained by a surface oxidation stage or by a method of "sol-gel" type.

The polymer-ceramic composites of the invention are obtained by:
 mixing the ceramic powder(s) constituting the ceramic charge with the polymer(s) constituting the polymer matrix or with a precursor of the polymer. Optionally, mixing can be carried out in a solvent which makes it possible to dissolve a portion of the precursors of the polymer.

shaping the mixture, for example by extrusion, rolling, pressing or injection molding, optionally heat treating.

The polymer-ceramic composites can thus be provided in the form of thin films (with a thickness generally of between 10 and 500 microns), in particular for embedded capacitors. They can also be provided in the form of shaped parts, in particular for the attenuation of electromagnetic waves.

The invention also relates to the products comprising polymer-ceramic composites according to the invention. Such products are in particular elements for electronics, such as, for example, embedded capacitors, shielding or protective elements for attenuation of electromagnetic waves or any other electronic component or component for electronics in which a sufficient permittivity is necessary.

In order not to unnecessarily encumber the present description, not all the possible combinations according to the invention between the various forms as described above have been given. However, it is clearly understood that all the possible combinations of the initial and/or preferred ranges and values described above are envisaged at the time of the filing of the present application and should be regarded as described by the applicant in the context of the present description (in particular of two, three or more combinations).

The examples which follow, although non-limiting of the scope of the present invention, illustrate the advantages thereof.

In a first step, four ceramic charge powders are prepared:

preparation of fused grains of barium titanate suboxides and then grinding in order to obtain a powder with a median diameter $d_{50}$ equal to 1.55 μm (powder P1);

preparation of fused grains of barium titanate suboxides and then grinding in order to obtain a powder with a median diameter $d_{50}$ equal to 1.42 μm (powder P2);

preparation of fused grains of titanium suboxides of general formulation $TiO_x$ with x=1.78 and then grinding in order to obtain a powder with a median diameter $d_{50}$ equal to 1.35 μm (powder P3).

It is observed that the powders P1 to P3 have a very dark blue color, testifying to their substoichiometric reduced state.

Use is made, as reference (Ref.), of a $BaTiO_3$ powder sold by Sigma-Aldrich, white in color, exhibiting a median diameter $d_{50}$ of 0.93 μm.

The chemical composition and the crystalline phases present are analyzed starting from the powder formed of fused grains. The results are given in tables 1 and 2 which follow.

Polymer-ceramic composites are subsequently obtained by:

respectively mixing the various powders Ref., P1, P2 and P3 (constituting the ceramic charge) with an ALTS acrylic resin supplied by ESCIL (constituting the polymer matrix), so that the ceramic charge represents 20% by volume of the final composite mixture;

shaping the mixture by hot pressing at 180° C., in the form of a sample with a diameter of 25 mm and with a thickness of 5 mm.

The permittivity of the polymer-ceramic composites thus obtained is subsequently measured. The results are combined in table 3 which follows.

The experimental protocols used for the characterization of the composition and of the properties of the various samples obtained are as follows:

1.) The overall chemical composition of the grains of barium/strontium titanate suboxides (powders P1 and P2) was determined by X-ray fluorescence. The results obtained, given as percentage by weight, are combined in table 1 which follows.

2.) The "x" value of the grains in the general formulation $TiO_x$ (powder P3) was determined by virtue of a test consisting in measuring the increase in weight of a sample brought to 1000° C. under air, which will oxidize until the stoichiometry $TiO_2$ is reached. Heating is continued until the weight of the sample stabilizes. The final increase in weight, corresponding to the difference between the stoichiometric compound $TiO_2$ and the initial composition, makes it possible to calculate the value of x of the general formula $TiO_x$. The content of impurities is determined by X-ray fluorescence. It is thus determined that the sample tested exhibits a total content of impurities of between 1% and at most 4% by weight. The results obtained, given as percentage by weight, are combined in table 2 which follows.

3) The crystalline phases present in the fused grains were characterized by X-ray diffraction. The results obtained are combined in tables 1 and 2 which follow. In these tables, MaP indicates a main phase, MiP indicates the presence of at least one other minor phase and "~" means that the phase(s) is (are) present in the form of traces. It is considered, within the meaning of the present invention, that a phase is "main" when it is the predominant phase and preferably represents at least 25%, indeed even at least 35%, of the total weight of the grains. It is considered that a phase is "minor" when it represents more than 5% and less than 25% of the weight of the grains, in particular more than 5% and less than 25% of the weight of the grains. It is considered that a phase is in the form of "traces" when it represents less than 1% of the total weight of the grains.

4.) The permittivity of the samples is measured according to the standard ASTM D150 at 100 hertz. The results obtained are combined in table 3 which follows.

TABLE 1

|  | Ref. | P1 | P2 |
|---|---|---|---|
| BaO | 65.1 | 63.3 | 65.6 |
| SrO | <0.1 | 0.4 | 0.4 |
| $TiO_2$ | 34.7 | 36 | 33.7 |
| Phases | $BaTiO_3$ in the tetragonal or cubic form (MaP) | $BaTiO_y$ in the hexagonal form (MaP) $BaTiO_y$ in the tetragonal form (~) | $BaTiO_{2.85}$ (MaP) $Ba_2TiO_4$ (MiP) $BaTiO_y$ in the tetragonal form (~) |

TABLE 2

|  | P3 |
|---|---|
| $SiO_2$ | 0.6% |
| $Al_2O_3$ | <0.1% |
| $Fe_2O_3$ | 0.2% |
| $ZrO_2$ | 0.3% |
| $Nb_2O_5$ | 0.2% |
| x | 1.78 |
| Phases | $Ti_5O_9$ (MaP) $Ti_3O_5$ (MiP) $Ti_4O_7$ (MiP) $Ti_6O_{11}$ (MiP) |

TABLE 3

|  | Ref. | P1 | P2 | P3 |
|---|---|---|---|---|
| Permittivity | 8.43 | 13.28 | 12.7 | 12.24 |

Results given in the tables which precede show that the polymer-ceramic composites according to the invention thus exhibit a substantially improved permittivity with respect to the polymer-ceramic composites using a reference ceramic powder.

The invention claimed is:

1. A polymer-ceramic composite comprising a polymer and grains of barium and/or strontium titanate suboxides of general formulation $Ba_{(1-m)}Sr_mTiO_y$ in which y is greater than or equal to 1.50 and less than 2.90, and m is between 0 and 1, limits included.

2. The polymer-ceramic composite as claimed in claim 1, comprising more than 10% by volume of grains of barium/strontium titanate suboxides of general formulation $Ba_{(1-m)}Sr_mTiO_y$ in which y is greater than or equal to 1.50 and less than 2.90, and m is between 0 and 1, limits included.

3. The polymer-ceramic composite as claimed in claim 1, wherein m is between 0 and 0.3, limits included.

4. The polymer-ceramic composite as claimed in claim 1, wherein the polymer represents from 30 to 80% by volume of said composite.

5. The polymer-ceramic composite as claimed in claim 1, wherein the grains of barium/strontium titanate suboxides together represent from 30 to 70% by volume of said composite.

6. The polymer-ceramic composite as claimed in claim 1, wherein the polymer and the barium/strontium titanate suboxides together represent more than 70% of the total weight of the composite.

7. The polymer-ceramic composite as claimed in claim 6, wherein the polymer and the barium/strontium titanate suboxides together represent more than 90% of the total weight of the composite.

8. The polymer-ceramic composite as claimed in claim 1, wherein the polymer is selected from the group consisting of epoxy, polyvinylidene fluoride (PVDF), polytetrafluoroethylene (PTFE), polyimide, polyamide, acrylate, polyphenylene ether, polyphenylene oxide, benzocyclobutene, bismaleimide, cyanate ester or polyester and any mixture thereof.

* * * * *